United States Patent
Krueger

(10) Patent No.: US 8,694,072 B2
(45) Date of Patent: Apr. 8, 2014

(54) CONTINUOUS MECHANICAL TUNING OF TRANSFORMERS INSERTED IN RF-SAFE TRANSMISSION LINES FOR INTERVENTIONAL MRI

(75) Inventor: Sascha Krueger, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 97 days.

(21) Appl. No.: 13/141,095

(22) PCT Filed: Nov. 23, 2009

(86) PCT No.: PCT/IB2009/055300
§ 371 (c)(1),
(2), (4) Date: Jun. 21, 2011

(87) PCT Pub. No.: WO2010/076684
PCT Pub. Date: Jul. 8, 2010

(65) Prior Publication Data
US 2011/0314662 A1 Dec. 29, 2011

Related U.S. Application Data

(60) Provisional application No. 61/141,947, filed on Dec. 31, 2008.

(51) Int. Cl.
*A61B 5/05* (2006.01)

(52) U.S. Cl.
USPC .......................................... 600/410

(58) Field of Classification Search
None
See application file for complete search history.

(56) References Cited

U.S. PATENT DOCUMENTS

| 1,493,713 | A | * | 5/1924 | Joseph | 336/20 |
| 3,795,855 | A | * | 3/1974 | Browning | 324/322 |
| 4,572,198 | A | | 2/1986 | Codrington | |
| 5,274,393 | A | * | 12/1993 | Scott | 343/895 |
| 7,405,567 | B2 | | 7/2008 | McDowell | |
| 2001/0056232 | A1 | | 12/2001 | Lardo et al. | |

FOREIGN PATENT DOCUMENTS

WO 2006003566 A1 1/2006

OTHER PUBLICATIONS

Ladd et al., Reduction of Resonant RF Heating in Intravascular Catheters Using Coaxial Chokes, Magnetic Resonance in Medicine 43:615-619, 2000.*

By A. Krafft et al: "Bi Field-Insensitive Transformers for RF-Safe Transmission Lines" Magnetic Resonance Materials in Physics, Biology and Medicine, Chapman and Hall, London, GB, vol. 19, No. 5, Nov. 18, 2006, XP019445959 ISSN: 1352-8661, pp. 257-266.

(Continued)

Primary Examiner — Long V. Le
Assistant Examiner — Bo J Peng

(57) ABSTRACT

A transformer line (46) extends through a catheter or other interventional instrument (30) that is to be used in the examination region (14) of a magnetic resonance imaging apparatus (10). The transformer line includes pairs of transformer windings (28) which are tuned in order to adjust the operating frequency and the maximum attenuation frequencies. Eccentric cams or other tuning elements (50, 64) are disposed in the transformer windings. Rotating the eccentric cams mechanically changes the geometry of the transformer windings, changing their inductive properties, and thus the frequency to which each is tuned.

19 Claims, 6 Drawing Sheets

(56) References Cited

OTHER PUBLICATIONS

By B. Gleich et al: "A Safe Transmission Line for MRI" IEEE Transactions on Biomedical Engineering, IEEE Service Center, Piscataway, NJ, US, XP011132094 ISSN: 0018-9294 the whole document. vol. 52, No. 6, Jun. 1, 2005, pp. 1094-1102.

By S. Weiss et al: "Transmission Line for Improved RF Saftety of Interventional Devices" Magnetic Resonance in Medicine, Academic Press, Duluth, MN, US, vol. 54, Jan. 1, 2005, XP002341652 ISSN: 0740-3194 the whole document pp. 182-189.

By P. Vernickel et al.: "A Safe Transmission Line for MRI"; IEEE Transactions on Biomedical Engineering, Vo. 52, No. 6; Jun. 6, 2005. pp. 1094-1102.

* cited by examiner

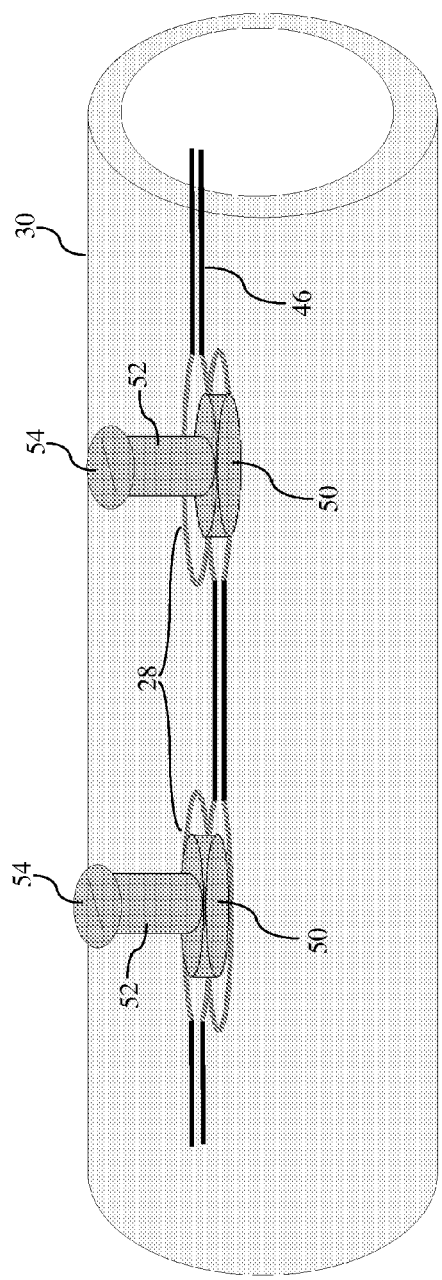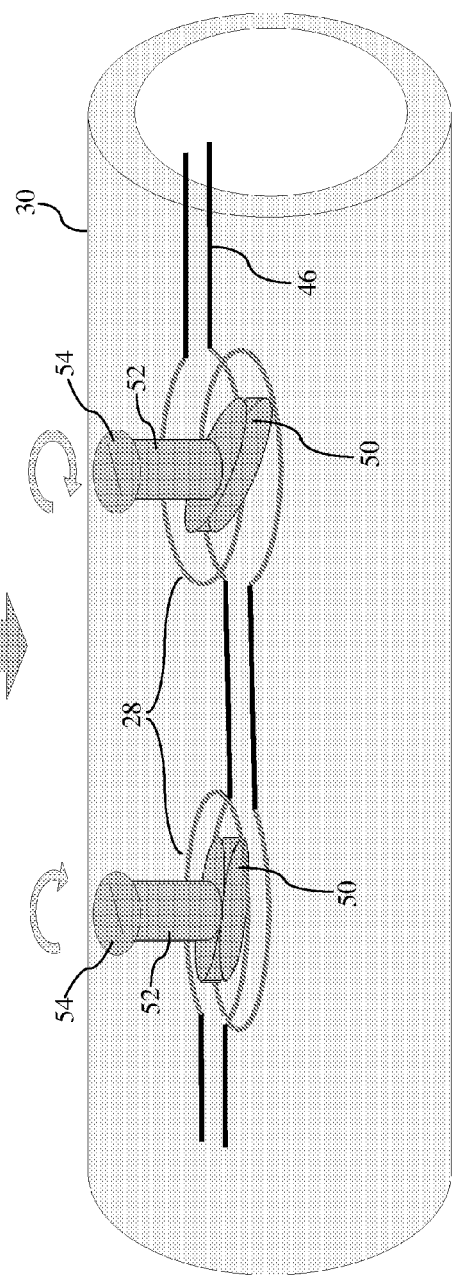
FIGURE 4A
FIGURE 4B

CONTINUOUS MECHANICAL TUNING OF TRANSFORMERS INSERTED IN RF-SAFE TRANSMISSION LINES FOR INTERVENTIONAL MRI

CROSS REFERENCE TO RELATED APPLICATIONS

This application claims the benefit of U.S. provisional application Ser. No. 61/141,947 filed Dec. 31, 2008, which is incorporated herein by reference.

The present application relates to a magnetic resonance apparatus which is provided with an active interventional device intended for use during the examination of a patient or other object during MR imaging. It finds particular application in improving safety, particularly in transmission lines.

A MR imaging system is often used for the examination and treatment of patients. By such a system, the nuclear spins of the body tissue to be examined are aligned by a static main magnetic field $B_0$ and are excited by transverse magnetic fields $B_1$ oscillating in the radiofrequency band. The resulting relaxation signals are exposed to gradient magnetic fields to localize the resultant resonance. The relaxation signals are received in order to form in a known manner a single or multiple dimension image.

Two types of MR systems that are in common use include "open" MR systems (vertical system) and "bore-type" systems. In the former, the patient is introduced into an examination zone which is situated between two magnetic poles connected by a c-shaped unit. The patient is accessible during the examination or treatment from practically all sides. The latter comprises a cylindrical examination space (axial system) into which a patient is introduced.

An RF coil system provides the transmission of RF signals and the reception of resonance signals. In addition to the RF coil system which is permanently built into the imaging apparatus, use is also made of surface coils which can be flexibly arranged, for example, as a sleeve or pad around or in a specific region to be examined.

Furthermore, use is made of active interventional devices which are introduced into the patient, for example, in order to take a tissue sample or perform a surgical act while the patient is in the imager. The interventional device usually has at least one coil element at its distal tip for the purpose of localization in the image formed or for the purpose of imaging.

Transmission lines or paths are provided for connecting the distal tip and/or other components in interventional devices like catheters, needles, stents, imaging coils, guidewires, and the like with an active unit, notably a power supply, a receiving/transmission device, a control unit, or the like. The active interventional devices usually have to be guided through MR fields which in the case of an MR system includes the $B_1$ field, generated in the form of RF pulses which are transmitted by the RF coil system. Such RF fields may induce common mode signals (currents) in the transmission line and in the surrounding body tissue. Such common mode signal can cause large electric fields. These currents create not only the risk of disturbances or destruction of the accessory device and/or the active unit, but notably they can give rise to substantial heating of the adjacent tissue resulting in potentially severe burns of inner organs or blood/tissue coagulation for the patient.

To address these issues, safe transformer lines (STLs) have been proposed. By dividing the transmission line into short segments, inductively coupling the segments using transformers, and properly tuning the inductance/capacitance, the transmission line can be tuned to be non-resonant and therefore non-conductive for the problematic common mode currents while being resonant and therefore highly conductive for differential mode currents making the actual MR signal. The transformers inductively transmit the transmission line signal while robustly attenuating induced RF currents in the transmission line without having to use parallel resonant circuits that choke the RF currents which can generate hazardous localized heating, are bulky, and expensive to manufacture.

In practice, the safe transformer lines are initially tuned in the laboratory to the desired operating frequency. The STL is then integrated into the interventional device. The tuning does not anticipate variable environmental conditions such as the effect of the catheter structure as well as the effect of body tissue, air, bones, blood, and other electronic components in the device which can affect signal quality. Also, the transmission line segments and the transformers of the transformer line may not be tuned as designed, e.g. due to tolerances of the components, which can further degrade applicability.

The present application provides a new and improved safe transformer line that can be tuned to a particular environment after full device assembly which overcomes the above-referenced problems and others.

In accordance with one aspect, a transformer line is provided for use in any of a variety of catheters or interventional instruments. At least one pair of transformer windings which inductively couple transmission line segments are disposed in the interventional instrument. At least one tuning element is disposed adjacent at least one of the transformer windings and is configured to adjust a geometry of the transformer windings.

In accordance with another aspect, a method is provided for using a transformer line which includes at least one pair of transformer windings which inductively couple transmission line segments. The transformer line is mounted in an interventional instrument, such as a catheter. At least one tuning element which is disposed in the interventional instrument adjacent at least one of the transmission windings is used to adjust a geometry of the transformer windings.

One advantage allows for adjustments to the interventional device post manufacture.

Another advantage is that the design allows for multiple parallel lines to be integrated into the interventional device.

A further advantage resides in improved imaging, visualization, and localization.

Still further advantages of the present invention will be appreciated by those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

FIGS. 4A and 4B are schematic views of a transformer line with integrated turn-dilators to adjust the geometry of the transformer windings;

Figure 1:
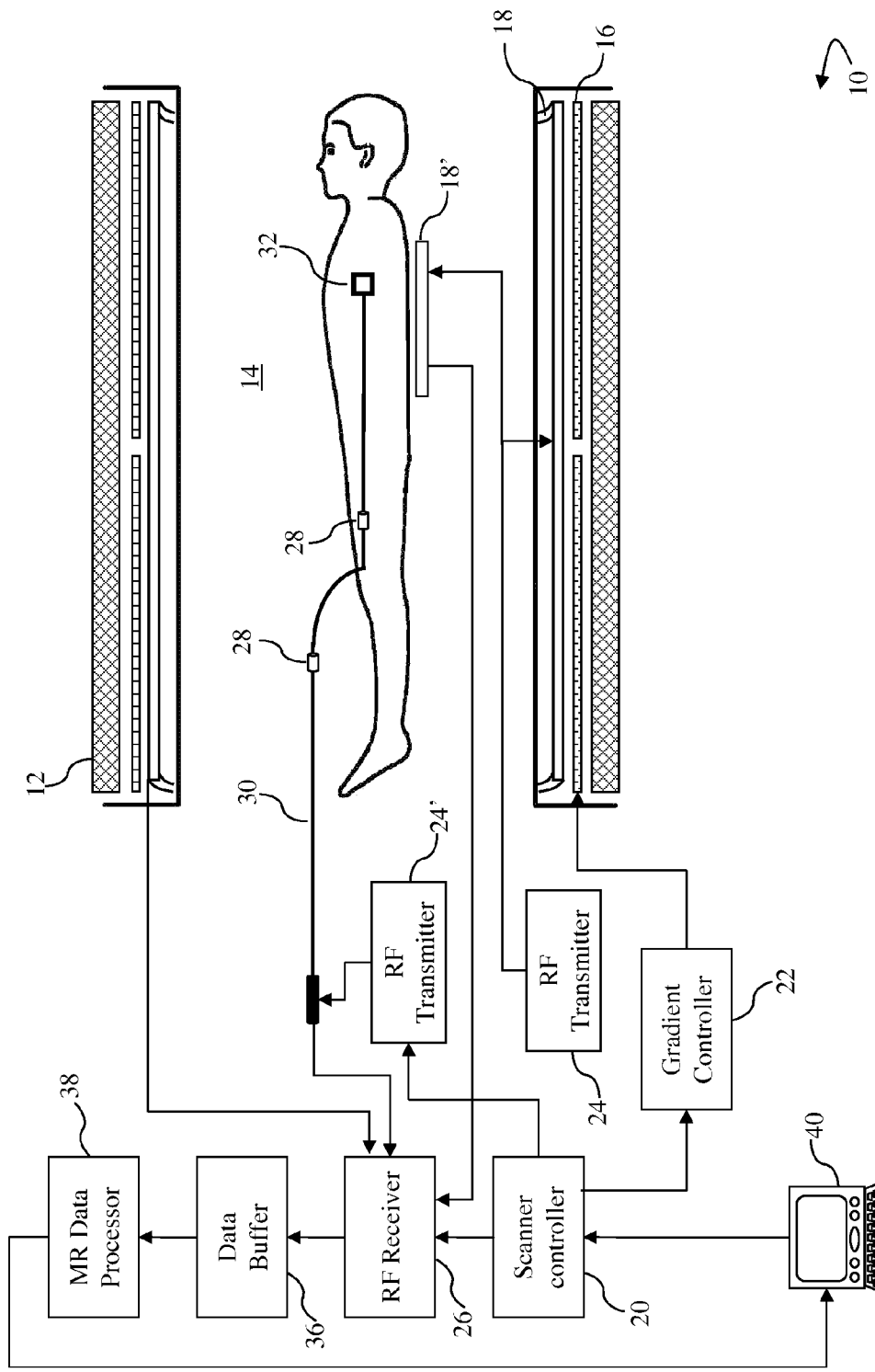
FIG. 1 is a diagrammatic side view in partial section of an MR apparatus along with an interventional instrument with continuously tunable transformer line.

With reference to FIG. 1, a magnetic resonance imaging system 10 includes a main magnet 12 which generates a temporally uniform $B_0$ field through an examination region 14. The main magnet can be an annular or bore-type magnet, a C-shaped open magnet, other designs of open magnets, or the like. Gradient magnetic field coils 16 disposed adjacent the main magnet serve to generate magnetic field gradients along selected axes relative to the $B_0$ magnetic field. A radio frequency coil, such as a whole-body radio frequency coil 18 is disposed adjacent the examination region. Optionally, local or surface RF coils 18' are provided in addition to or instead of the whole-body RF coil 18.

A scan controller 20 controls a gradient controller 22 which causes the gradient coils to apply selected magnetic field gradient pulses across the imaging region, as may be appropriate to a selected magnetic resonance imaging or spectroscopy sequence. The scan controller 20 also controls an RF transmitter 24 which causes the whole-body or local RF coils to generate magnetic resonance excitation and manipulation $B_1$ pulses. The scan controller also controls an RF receiver 26 which is connected to the whole-body or local RF coils to receive magnetic resonance signals therefrom.

An interventional instrument, such as a catheter 30, is held by the surgeon or clinician. Various other types of interventional instruments and catheters are contemplated. For example, the catheter may include a guide wire, a stent, an injector, a passage for introducing contrast agents or other fluids, etc. The catheter or other interventional instrument, in the illustrated embodiment, has a coil 32 disposed at a tip end thereof. Optionally, additional coils may be disposed along the length of the catheter. Optionally, other electrical equipment such as an amplifier, matching and tuning circuitry, or other circuitry, may be disposed in the tip of the catheter adjacent the coil 32. The catheter, particularly electrical conductors therein, are inductively coupled with the RF receiver 26 and/or an RF transmitter 24' via a safe transformer line with integrated deformable transformers 28 for tuning an assembled catheter or other interventional instrument. The RF transmitter 24' can be the same as the RF transmitter 24. Alternately, as illustrated in FIG. 1, the RF transmitters 24 and 24' can be different transmitters to facilitate the significantly different transmit power levels.

The interventional instrument coil 32 can be used in various ways. In one embodiment, RF localization signals are applied via the RF transmitter 24' to the coil 32. The localization signals are applied concurrently with gradients such that the frequency is indicative of location. In embodiments in which the coil 32 receives resonance signals induced in the adjacent tissue by the whole-body RF coil 18 or a local RF coil 18' on the exterior of the patient, the received resonance signals are sent to the RF receiver 26, which is preferably digital, to be processed analogous to other received magnetic resonance signals. Various other localization techniques are known. In some localization techniques, the coil 32 is caused to switch between resonant and non-resonant configurations. The magnetic field gradients 16 can be applied for spatially localizing the locator RF signal in a separate localization process or the localization of the coil can be processed concurrently with processing of the magnetic resonance signals. Various other electrical functions can also be performed in the interventional instrument. The STL is also able to transmit any type of signal that may be required for the respective functionality and can be also used to deliver power to active parts of the instrument. To this end, the respective signal may be frequency-modulated before transmission and demodulated afterwards in the receiver or for example, at the active element at the tip or elsewhere in the device. This is typically done for low frequency signals that are otherwise not transmitted efficiently via the inductive coupling-based STL.

The received data from the receiver 26 is temporarily stored in a data buffer 36 and processed by a magnetic resonance data processor 38. The magnetic resonance data processor can perform various functions as are known in the art, including image reconstruction, magnetic resonance spectroscopy, catheter or interventional instrument localization, and the like. Reconstructed magnetic resonance images, spectroscopy readouts, interventional instrument location information, and other processed MR data are displayed on a graphic user interface 40. The graphic user interface 40 also includes a user input device which a clinician can use for controlling the scan controller 20 to select scanning sequences and protocols, and the like.

Figure 2B:
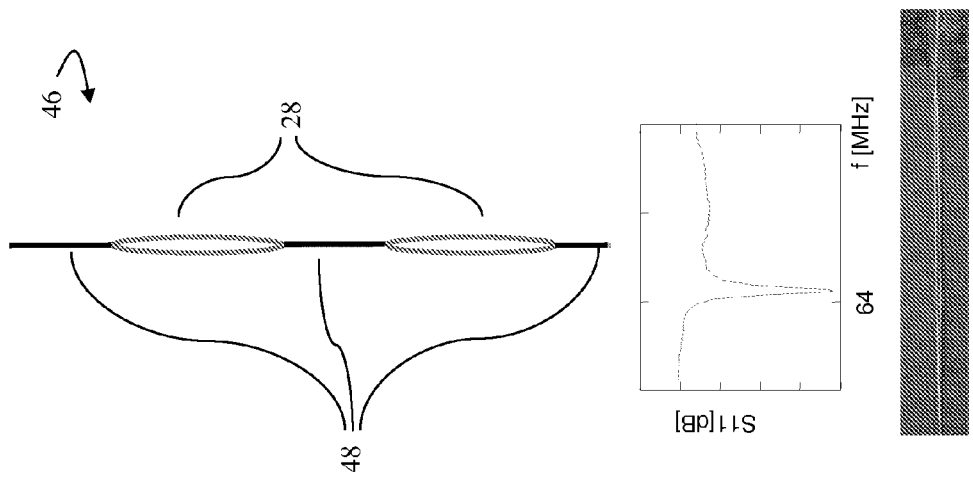
FIGS. 2A and 2B are a demonstration of the frequency response of a continuously tunable transformer line.
Figure 2A:
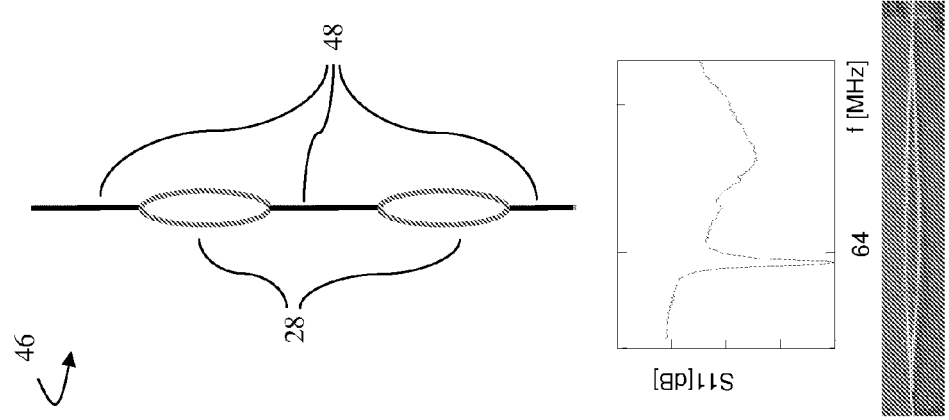

With reference to FIGS. 2A and 2B, transformer line 46 includes segments of transmission line 48 that are inductively coupled to one another by the deformable transformers 28. The transformers are spaced at not more than quarter wavelength intervals (at the resonance frequency) in order to block the transfer of direct currents, off-resonance frequency currents, and common-mode resonance. More specifically, when the transformers 28 are in one state of deformation (or non-deformation), a signal is minimally attenuated just above 64 MHz, but attenuated at frequencies below this frequency. By changing the deformation as illustrated diagrammatically in FIG. 2B, the working frequency is shifted to just below 64 MHz. In this manner, the transformer deformation can be adjustably performed until the working frequency is moved to a selected frequency.

Figure 3:
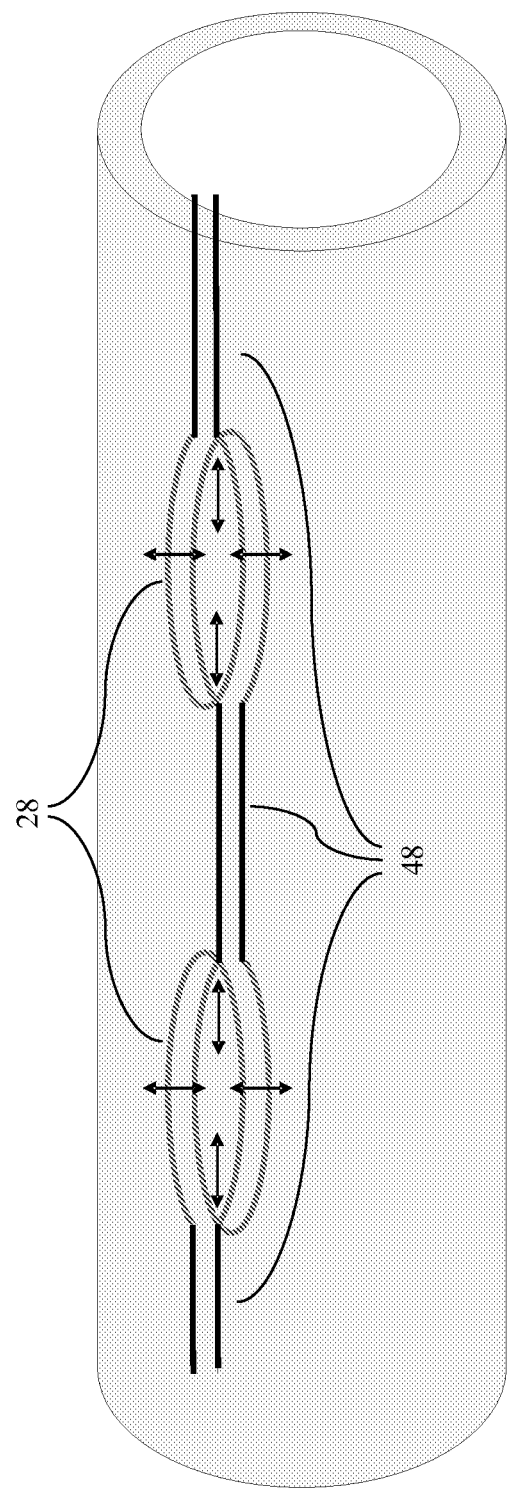
FIG. 3 is a schematic view of a transformer line with deformable windings inside an interventional instrument such as a catheter or guidewire.

With reference to FIG. 3, the transformer coil pairs 28 connecting the transmission line segments 48 are configured such that they can be deformed in any of a plurality of directions. For example, the coils can be moved closer together or further apart. As another example, one of the coils may be elongated relative to the other. As another example, the coils can be transversely deformed. Various other mechanical deformations which modify the minimum impedance frequency of the transformer are contemplated.

In the embodiment of FIG. 4A and FIG. 4B, the transformer line 46 is embedded in a catheter or other interventional device 30 which alters the frequency passing/attenuating characteristics of the transmission line due to other active components or material in the proximity of a transformer. Adjacent each transformer, a rotatable, eccentric cam 50 is embedded in the catheter 30 adjacent the transformers 28. The cams, in this embodiment, are connected with shafts 52 which, in turn, are connected with elements 54 for receiving a tool for rotating the cams 50. The cams 50 are positioned relative to the transformers 28, e.g., concentrically with the windings of the transformers 28, such that rotation of the cams 50 as illustrated in FIG. 4B, alters the shape and/or other physical characteristics of the transformers 28, and hence the frequencies which the coils pass and the frequencies which they attenuate. In this manner, each of the cams can be turned individually until its respective coil is tuned to the selected operating frequency. Typically, the transformers are tuned starting with the transformer closest to the distal tip, working backwards toward the end that is manipulated by the clinician and connected with the peripheral electronics.

Figure 5:
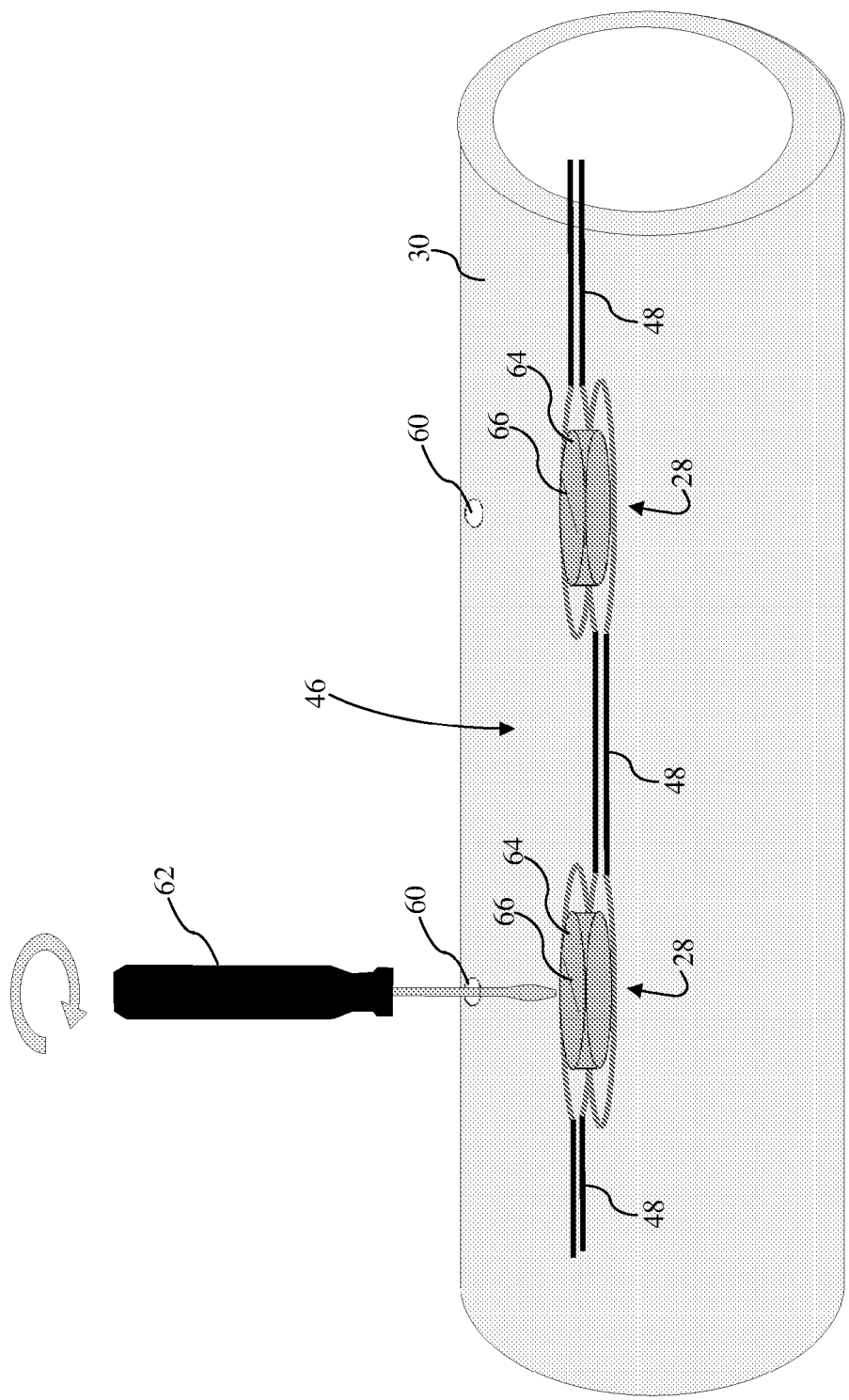
FIG. 5 is a schematic view of a transformer line with integrated turn-dilators to be operated though an access port for use with a turning tool.

With reference to FIG. 5, other mechanical mechanisms for altering the physical characteristics of the transformers 28 are also contemplated. For example, the catheter or other interventional device can have apertures 60 defined through which a rotational tool 62, such as a screwdriver can extend in order to engage an eccentric cam 64 located adjacent one of the transformers 28. The eccentric cam includes a mechanical structure, a slot in the case of a screwdriver, for engaging the rotating tool 62. Optionally, once the cams have been rotated and the transformers have been appropriately tuned, the holes may be filled or sealed with a sealant which locks the cams in place and prevents further access. The sealant is preferably biocompatible, resistant to sterilants, and forms a fluid-tight seal.

Figure 6:
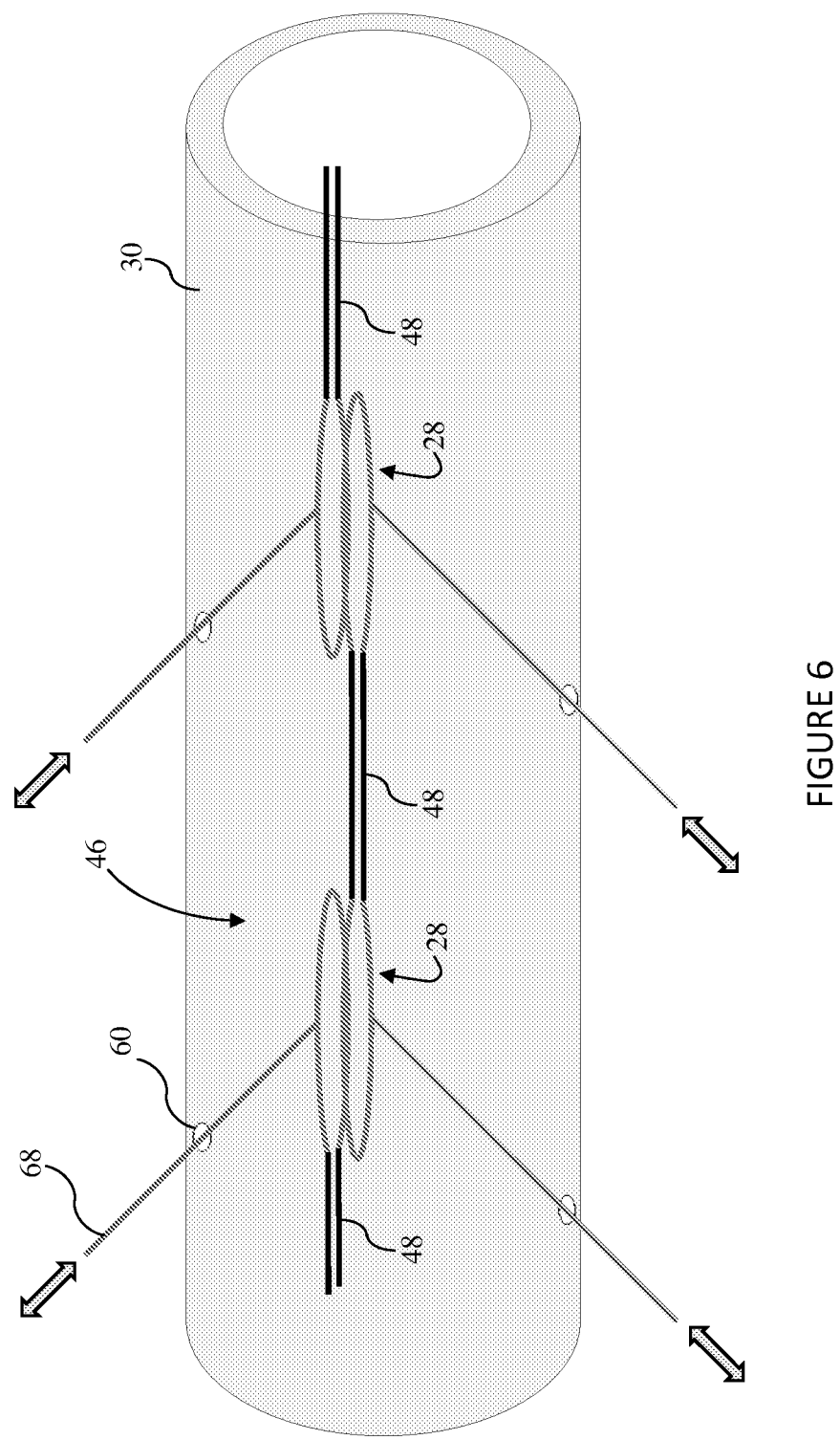
FIG. 6 is a schematic view of a transformer line with integrated control wires to be operated though an access port for pushing and/or pulling the transforming windings.

With reference to FIG. 6, the transformer shape can be adjusted by control wires or rods 68 attached to the distal and/or proximal part of each transformer that may initially have, for example, a convex shape, so that pushing or pulling one end with respect to the other results in controllable deformation (stretching or warping) and hence tuning of the transformers.

Other mechanisms for changing the inductance and the frequency characteristics of the transformers are also contemplated. For example, rather than the eccentric cam 64, the port 60 can connect with a hollow cavity which is filled with a sealant under pressure which expands the coil windings. Once the desired frequency is attained, the sealant is cured such that the transformer is held in the selected degree of deformation.

In another optional embodiment, a bias is provided which biases the transformer windings inwards. In this manner, by rotating the cam in the opposite direction or reducing the pressure of the deforming polymer, the transformer can be tuned in the opposite sense.

In another embodiment, a hollow core of the transformer is filled with a material, such as ferrous or nickel nanoparticles, to change the inductance of the transformer.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A transformer line for use in an interventional instrument, the transformer line comprising:
   at least one pair of transformers configured to inductively couple transmission line segments disposed in the interventional instrument; and
   at least one eccentric tuning cam disposed concentrically in at least one of the transformers, the at least tuning cam being configured to adjust a geometry of the transformer.

2. The transformer line according to claim 1, wherein the at least one tuning cam is movable and configured to deform the transformer as the tuning cam is moved mechanically relative to the transformer.

3. The transformer line according to claim 2, wherein the interventional instrument defines an access port defined adapted to receive an insertable turning tool for moving the at least one tuning cam, the access port being sealable to cover the tuning cam.

4. The transformer line according to claim 2, further comprising:
   a shaft extending from the at least one tuning cam to an exterior of the interventional instrument for moving the at least one tuning cam.

5. The transformer line according to claim 2, wherein the tuning cam is rotatably disposed in the transformer windings.

6. The transformer line according to claim 2, wherein:
   the transformer comprises a resilient material which exerts a physical force on windings of the transformer in a direction opposite to a direction of deformation by the at least one tuning cam.

7. The transformer line according to claim 1, wherein the at least one tuning cam is configured to mechanically adjust a spacing between the transformers in the pair of transformers.

8. A catheter comprising:
   a coil disposed adjacent a tip end;
   a transformer line according to claim 1, extending through the catheter from the coil to a point of connection with associated electronic equipment.

9. A magnetic resonance system comprising:
   a magnet configured to generate a static magnetic field in an examination region;
   a radio frequency transmit coil configured to induce and manipulate magnetic resonance in a subject in the examination region and to acquire magnetic resonance data from the examination region; and
   the interventional instrument including a transformer line according to claim 1.

10. The magnetic resonance system according to claim 9, wherein the interventional instrument further comprises:
    an interventional instrument coil connected with the transformer line, wherein the transformer line is electrically connected with at least one of a radio frequency transmitter and a radio frequency receiver.

11. A method of using a transformer line which includes at least a pair of adjustable transformers for inductively coupling transmission line segments and a corresponding pair of eccentric tuning cams, the method comprising:
    installing the transformer line in an interventional instrument; and
    adjusting a geometry of each of the transformers after installing the transformer line by adjusting positions of the corresponding eccentric tuning cams, disposed concentrically in the transformers, in order to tune the transformer line.

12. The method according to claim 11, wherein adjusting the geometry of each of the transformers comprises rotating the corresponding tuning cam, each tuning cam comprising an eccentric element which mechanically deforms the transformer winding as it is rotated.

13. The method according to claim 12, wherein rotating the corresponding tuning cam comprises:
    inserting a tuning tool through an access port defined through the interventional instrument and moving the tuning cam to deform the transformer;
    removing the tuning tool; and
    sealing the access port.

14. The method according to claim 11, further comprising:
    positioning a subject in a magnetic resonance imaging system;
    using the interventional instrument within the magnetic resonance imaging system; and
    performing magnetic resonance imaging while the interventional instrument is located in the magnetic resonance imaging system.

15. The transformer line according to claim 1, wherein the at least one tuning cam is configured to mechanically adjust a radius of windings of each of the transformer in the pair of transformers.

16. A transformer line for use in an interventional instrument, the transformer line comprising:
- a plurality of transmission line segments;
- a plurality of transformers configured to inductively couple the plurality of transmission line segments; and
- a plurality of tuning elements corresponding to the plurality of transformers, each tuning element comprising an eccentric cam disposed concentrically in the corresponding transformer and configured to change a state of mechanical deformation or non-deformation of the transformer upon rotation of the eccentric cam.

17. The transformer line according to claim 16, wherein rotation of the eccentric cam mechanically adjusts spacing between adjacent transformers of the plurality of transformer windings.

18. The transformer line according to claim 16, wherein rotation of the eccentric cam mechanically adjusts a radius of the transformer.

19. The transformer line according to claim 16, further comprising:
- a plurality of shafts respectively extending from the plurality of tuning elements to an exterior of the interventional instrument to enable rotation of the tuning elements.

* * * * *